(12) United States Patent
Takami et al.

(10) Patent No.: US 6,667,436 B2
(45) Date of Patent: Dec. 23, 2003

(54) EMC CORE SUPPORTING STRUCTURE

(75) Inventors: Satoshi Takami, Saitama-ken (JP);
Katsuhiko Furuya, Saitama-ken (JP);
Yukihiro Ishizuka, Tokyo (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 10/224,329

(22) Filed: Aug. 21, 2002

(65) Prior Publication Data
US 2003/0047336 A1 Mar. 13, 2003

(30) Foreign Application Priority Data
Aug. 22, 2001 (JP) ........................................ 2001-251293

(51) Int. Cl.[7] .............................................. H05K 9/00
(52) U.S. Cl. ............................. 174/35 R; 174/35 MS; 361/818; 361/752
(58) Field of Search .................... 174/35 R, 35 MS; 361/799, 800, 816, 818, 752, 753; 439/92, 95

(56) References Cited

U.S. PATENT DOCUMENTS 5,136,120 A * 8/1992 Craft et al. ............... 174/35 R
5,708,568 A * 1/1998 Ostendorf ................. 361/749
6,147,299 A * 11/2000 Ferguson ................. 174/35 R

FOREIGN PATENT DOCUMENTS

JP           02068998 A * 3/1990 ............ H05K/9/00

* cited by examiner

*Primary Examiner*—Dean A. Reichard
*Assistant Examiner*—Carmelo Oliva
(74) *Attorney, Agent, or Firm*—Greenblum & Bernstein, P.L.C.

(57) ABSTRACT

An EMC core supporting structure for supporting one or more EMC cores inside a casing, which accommodates a printed circuit board, includes a plate member capable of shielding electro-magnetic waves. Preferably, the plate member expanding inside the casing to substantially cover the printed circuit board, and at least one side portion of the plate member is connected to an inner wall of the casing. A supporting portion that receives the EMC core(s) is formed on a surface of the plate member opposite to a surface facing the printed circuit board for mounting the at least one EMC core on the plate member.

16 Claims, 6 Drawing Sheets

EMC CORE SUPPORTING STRUCTURE

BACKGROUND OF THE INVENTION

The present invention relates to a member for supporting an EMC (electromagnetic compatibility) ferrite core.

Conventionally, for EMC use of devices, an EMC ferrite core has been widely used for preventing unintended electromagnetic radiation, which causes noises in electronic devices such as medical devices and OA appliances. In particular, cables that connect such electronic devices with external devices can be transmission channels of noise components. Thus, typically, at proximal end portions of the cables, which are connected to circuit boards, the EMC cores are used. The EMC cores are very important for preventing the noise components. However, they require dedicated securing structure, and the securing position inside the electronic devices is limited.

FIG. 5A is a perspective view showing an inner structure of an circuit unit 90, which is provided at a proximal end portion of a scope unit 50 of an electronic endoscope shown in FIG. 6. On a printed circuit board 89 inside the circuit unit 90, a CCD driving circuit for supplying driving signals to a CCD provided at the distal end of the scope unit 50, and a signal processing circuit that processes the output of the CCD are provided.

The external connector 81 is used for connection with a processor unit, which processes the output of the CCD and generates a video signal. Through cables 86c and 87c connected to connectors 86 and 87 on the printed circuit board 89, the processor unit is connected to the printed circuit board 89. The processor unit accommodates a light source, which emits light to a light incident portion 80. The light is directed through a light guide 75 to the tip end of the scope unit.

A cable 88c, which is connected to a connector 88 mounted on the printed circuit board 89, is a cable including a bundle of signal transmission wires connected to the CCD, which is provided at the distal end portion of the scope unit. In some cases, an insertion portion 51 (see FIG. 6) of the scope unit is several meters long, and the signal cable 88c also has the same length. In order to prevent unnecessary radiation of electro magnetic wave inside the circuit unit 90, the signal cable 88c is inserted through EMC cores 77 and 78. The EMC cores 77 and 78 are secured inside the circuit unit 90. For this purpose, as shown in FIG. 5B, which shows a cross section taken along line A–A' of FIG. 5A, the EMC cores 77 and 78 are screwed on a side wall of a casing 100 using a supporting member 79. The circuit unit 90 is covered with a shielding cover 82 made of metal, which prevents unintended radiation of an electromagnetic wave from the printed circuit board 89.

As described above, an EMC core generally requires a particular supporting member, which is to be provided inside an electronic device. Further, a position where the supporting member is mounted inside the electronic device is limited. Therefore, using an EMC core may impede design freedom and/or sometimes prevent downsizing of electronic devices.

SUMMARY OF THE INVENTION

The present invention is advantageous in that an improved structure for securing an EMC core and a securing member used in such a structure are provided, which allows downsizing of devices, and provides improved design freedom.

According to embodiments of the present invention, there is provided an EMC core supporting structure for supporting one or more EMC cores inside a casing which accommodates a printed circuit board. The EMC core supporting structure includes a plate member capable of shielding electromagnetic waves. Preferably, the plate member expands inside the casing to substantially cover the printed circuit board, and at least one side portion of the plate member is connected to an inner wall of the casing. A supporting portion that receives the EMC core(s) is formed on a surface of the plate member opposite to a surface facing the printed circuit board for mounting the at least one EMC core on the plate member.

With this structure, since the plate member, which shields the electro-magnetic waves, is placed between the EMC core(s) and the printed circuit board, unintended or unnecessary electro-magnetic waves radiated from the printed circuit board will not reach the EMC core(s). Further, since the plate member functions for shielding the electromagnetic wave as well as for supporting the EMC core(s), it is not necessary to use an optional casing for shielding the printed circuit board.

In one embodiment, at least one side portion of the plate member includes a portion which is bent to form a U-shaped portion having two parallel surfaces facing each other and a connecting portion that connects the two parallel surfaces, the connecting portion being secured to the inner wall of the casing. Therefore, it is not necessary to provide a separate member for supporting the EMC core(s).

In a particular case, the at least one EMC core is held within a space defined by the two parallel surfaces and the connecting portion.

It is possible to secure the at least one EMC core and the connecting portion together on the inner wall using screws.

Alternatively, the at least one side portion of the plate member includes a portion that is bent to form an L-shaped portion, which is secured onto the inner wall of the casing.

In this case, an EMC core receiving portion may be integrally provided on the plate member, the at least one EMC core being held by the EMC core receiving portion. The EMC core receiving portion may be provided at any portion on the plate member. Thus, design freedom is well increased.

In a particular case, the EMC core receiving portion may have a U-shaped portion having two parallel surfaces and a connecting portion that connects the two parallel surfaces, the connecting portion being secured on the plate member, the at least one EMC core being held within a space defined by the two parallel surfaces and the connecting portion. Of course, any other configuration of the EMC core receiving portion can be employed.

Optionally, the L-shaped portion is secured on the inner wall using screws.

According to embodiments, only one side portion of the plate member is secured onto the inner wall, and an opposite side portion of the plate member may be bent to form a bent portion, which is bent toward the printed circuit board.

According to another aspect, there is provided a circuit board shielding structure employed in a casing which accommodates a printed circuit board, the shielding structure including a plate member capable of shielding electromagnetic waves, the plate member expanding inside the casing to substantially cover the printed circuit board, the casing having at least side walls capable of shielding electromagnetic waves, each of the side walls being substantially perpendicular to the surface of the printed circuit board, the side walls surrounding the printed circuit board, at least one side portion of the plate member being connected to an inner surface of one of the side walls, a supporting portion that receives at least one EMC core being formed on a surface of the plate member opposite to a surface facing the printed circuit board for mounting the at least one EMC core on the plate member.

Optionally, the shielding structure may include a lower plate arranged on an opposite side of the plate member with respect to the printed circuit board, the lower plate being capable of shielding electromagnetic waves, the lower plate having an area covering the printed circuit board, the printed circuit board being shielded by the plate member, the side walls and the lower plate.

According to another aspect, there is provided an EMC core supporting member having a plate member capable of shielding electromagnetic waves, a supporting portion for supporting an EMC core is formed on one surface of the plate member, a connection portion is formed on a side portion of the plate member, the connection portion being formed by bending the plate member.

Further provided is an EMC core supporting member formed of a plate member capable of shielding electromagnetic waves, which includes a shielding portion, and an EMC core supporting portion which is formed by bending the plate member corresponding to an external shape of at least one EMC core so as to hold the at least one EMC core.

Optionally, the supporting member is provided inside a casing of an electronic device, the EMC core supporting portion having an area contacting the casing, the EMC core supporting portion being secured to the casing at the area contacting the casing with screws.

According to a further aspect, there is provided a shielding structure for shielding a printed circuit board employed in an electronic device, including an EMC core supporting member arranged on one side of the printed circuit board, a shielding plate arranged on the other side of the printed circuit board. The EMC core supporting member formed of a plate member is capable of shielding electro-magnetic waves, the EMC core supporting member having a shielding portion and an EMC core supporting portion which is formed by bending the plate member corresponding to an external shape of at least one EMC core so as to hold the at least one EMC core, the EMC core supporting portion being formed on a surface of the EMC core supporting member opposite to a surface facing the printed circuit board.

Optionally, a casing of the electronic device is made of metal, and the EMC core supporting member is electrically connected with the casing.

BRIEF DESCRIPTION OF THE ACCOMPANYING DRAWINGS

FIGS. 1A and 1B schematically show a structure of an circuit unit employing an EMC core supporting member according to a first embodiment of the invention;

FIGS. 2A and 2B schematically show a structure of an circuit unit employing an EMC core supporting member according to a second embodiment of the invention;

FIGS. 3A and 3B schematically show a structure of an circuit unit employing an EMC core supporting member according to a third embodiment of the invention;

DETAILED DESCRIPTION OF THE EMBODIMENTS

Figure 1A:
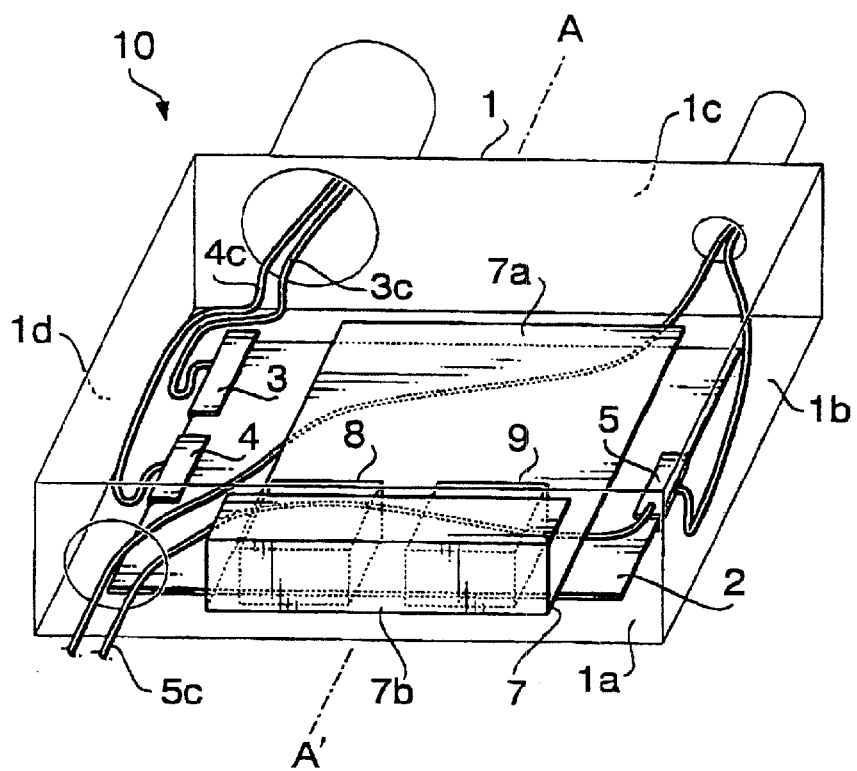
Figure 1B:
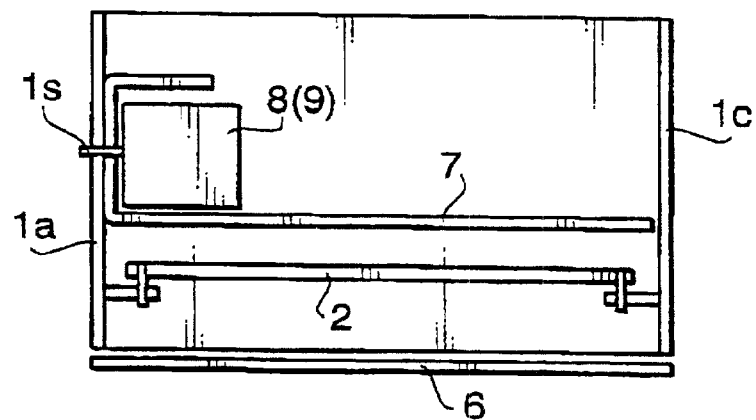

FIGS. 1A and 1B schematically show a structure of an circuit unit 10 of an electronic endoscope. The circuit unit 10 employs, as a component thereof, an EMC core supporting plate 7 according to a first embodiment of the invention. FIG. 1A is a perspective view showing an inner structure of the circuit unit 10. FIG. 1B is a cross section taken along line A–A' of FIG. 1A.

Figure 5A:
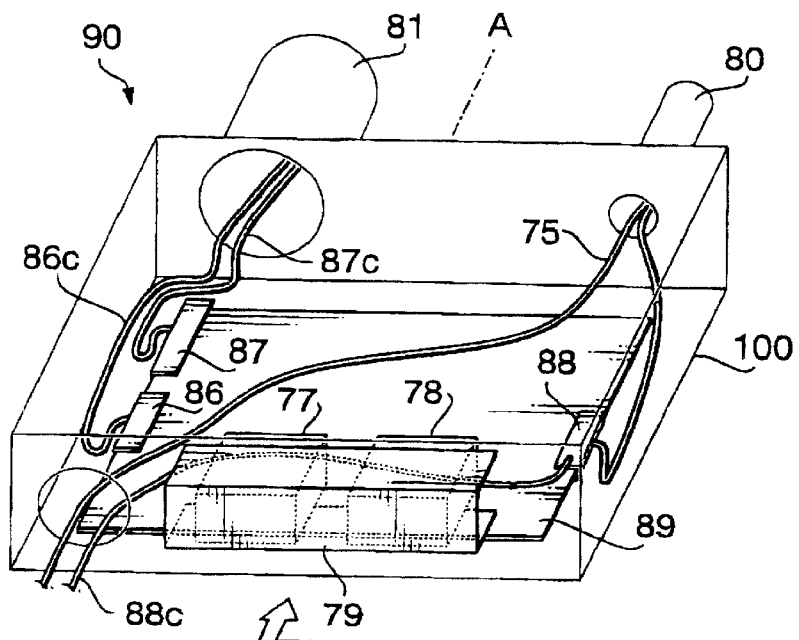
FIGS. 5A and 5B show an circuit unit employing a conventional EMC core supporting member.
Figure 5B:
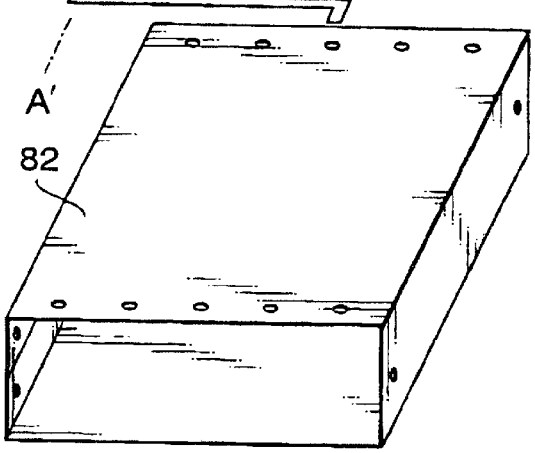
Figure 5B:
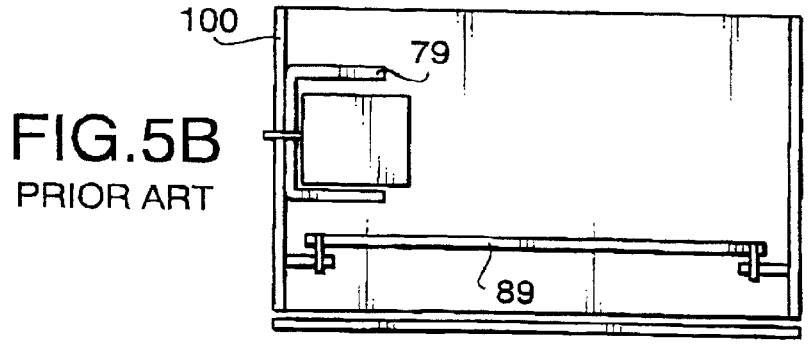
Figure 6:
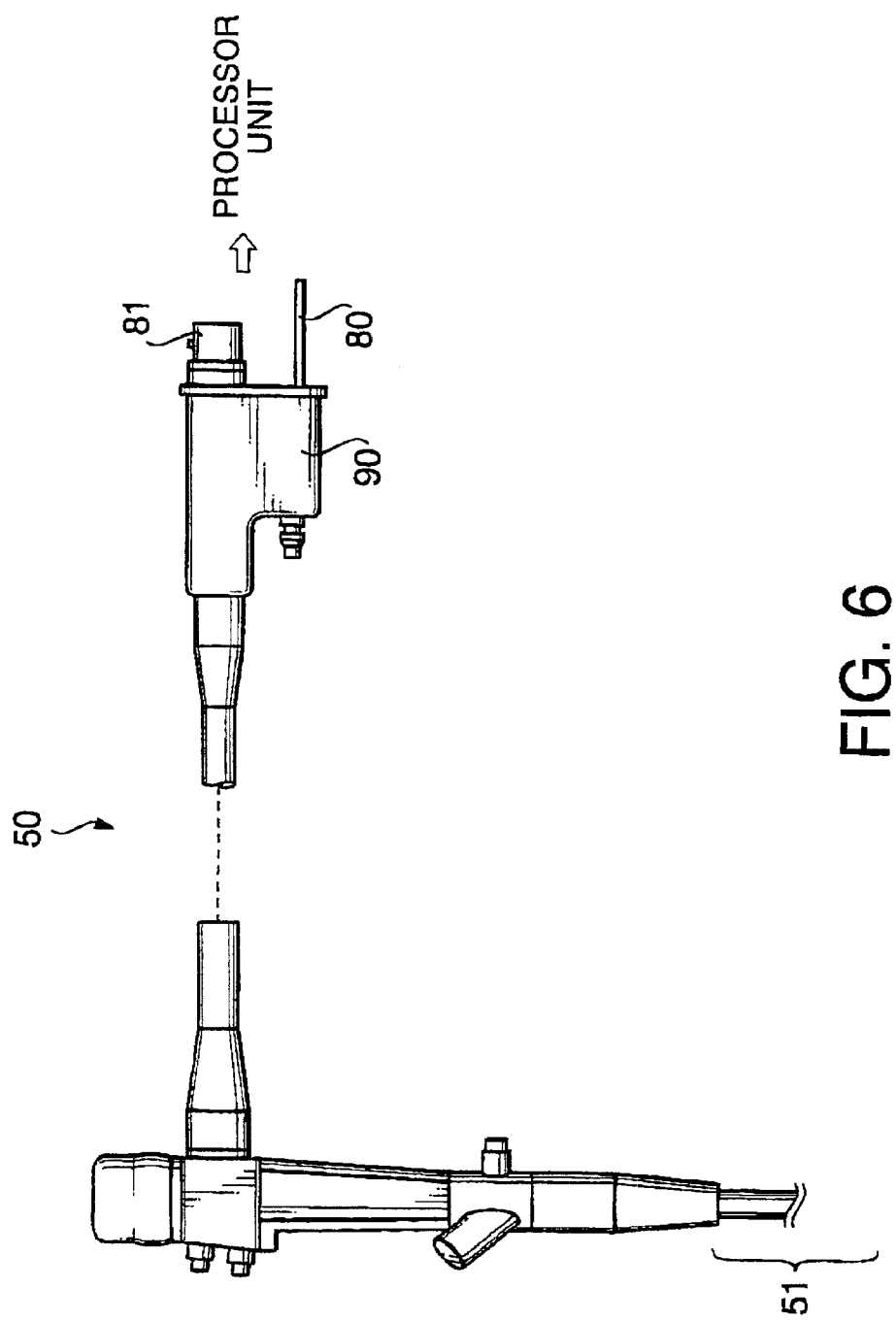
FIG. 6 shows an appearance of a scope unit for an electronic endoscope system.

Similar to the conventional printed circuit board 89 shown in FIGS. 5A and 5B, a printed circuit board 2 shown in FIG. 1A is a circuit board mounting a driving circuit for a CCD, which is provided at a distal end portion of the scope unit, and a signal processing circuit. The printed circuit board 2 is electrically connected to a processor unit through signal cables 3c and 4c, which are connected with connectors 3 and 4 provided on the printed circuit board 2. The printed circuit board 2 and the CCD are interconnected through a signal cable 5c, which is connected to a connector 5 mounted on the printed circuit board 2.

The EMC core supporting member 7 is a shielding plate formed of a single metal. A shielding section 7a of the supporting member 7 expands over an upper surface of the printed circuit board 2 so that it substantially covers the printed circuit board 2. The supporting member 7 has a U-shaped EMC core supporting portion 7b, which supports EMC cores 8 and 9. A signal cable 5c is inserted through each of EMC cores 8 and 9 to form a single or a plurality of windings, thereby unintended radiation from the signal cable 5c, and invasion of noise components therefrom can be prevented.

As shown in FIG. 1B, the EMC core supporting member 7 is secured on a side surface 1a of a housing 1 with screws 1s. The side surfaces 1a through 1d are made of metal, and the EMC core supporting member 7 is electrically connected with the housing 1. Below a lower surface of the printed circuit board 2, a shielding plate 6 having an area covering the printed circuit board 2 is arranged. By the side surfaces 1a through 1d, the EMC core supporting member 7 and the shielding plate 6, the entire printed circuit board 2 is shielded. It should be noted that, since the EMC cores 8 and 9 are arranged, on the EMC core supporting member 7, above a surface thereof opposite to a surface facing the printed circuit board 2, radiation of noise components from the printed circuit board 2 will not be transmitted to the cable 5c which is inserted through the EMC cores 8 and 9.

Thus, the EMC core supporting member 7 functions to (a) support the EMC cores 8 and 9; (b) shield the printed circuit board 2; and (c) shield the EMC cores from the printed circuit board 2. Because of the above-described configuration, the shield cover 82 as used in the conventional circuit unit 90 shown in FIGS. 5A and 5B is unnecessary.

Although the EMC core supporting member 7 is secured onto the housing 1 with a screw in the above-described embodiment, it is only an exemplary configuration, and any other securing measure which fixedly and electrically connects the EMC core supporting member 7 with the housing 1 can be employed.

Figure 2A:
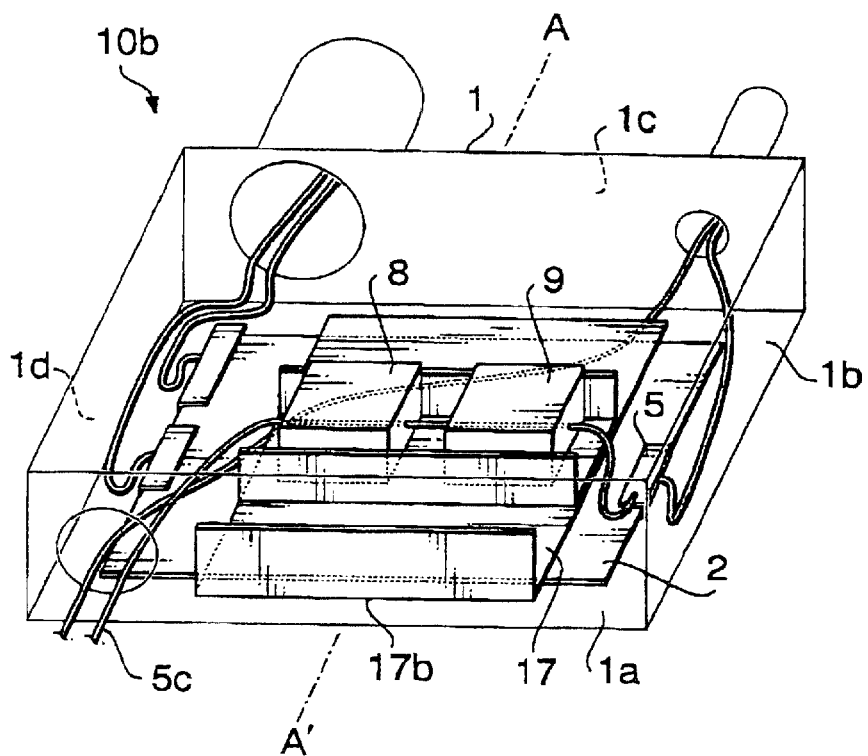
Figure 2B:
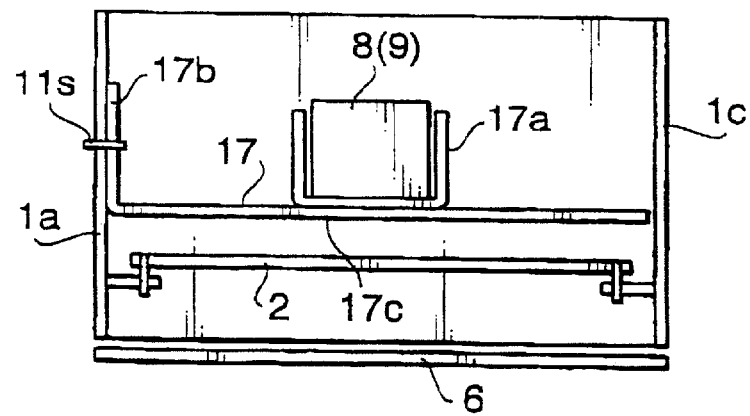

FIGS. 2A and 2B schematically shows a structure of an circuit unit 10b employing an EMC core supporting member 17 according to a second embodiment. FIG. 2A shows a perspective view of an inner structure of the circuit unit 10b.

FIG. 2B is a cross section of the circuit unit taken along line A–A' of FIG. 2A.

As shown in FIG. 2B, the EMC core supporting member 17 is configured such that a U-shaped EMC core supporting element 17a is fixed at a substantially central position of the core supporting member 17. A side portion of the EMC core supporting member 17 is formed to be a connection section 17b, which is bent at a right angle. The EMC core supporting member 17 is fixed on a side surface 1a of the housing 1 using screws 11s. It should be noted that the EMC core supporting member 17 is electrically connected with the side surface 1a. A bottom surface 17c of the EMC core supporting member 17 has an area covering the printed circuit board 2.

Similarly to the first embodiment, the side surfaces 1a through 1d are made of metal, and the EMC core supporting member 17 is electrically connected with the housing 1. By the side surfaces 1a–1d of the housing 1, the EMC core supporting member 17 and the shielding plate 6, the entire printed circuit board 2 is shielded. Since the EMC cores 8 and 9 are arranged on an upper surface of the EMC core supporting member 17, while a lower surface faces the printed circuit board 2, radiation of noise from the printed circuit board 2 will not be transmitted to a cable 5c inserted through the EMC cores 8 and 9.

It should be noted that the position of the EMC core supporting section 17a on the upper surface of the EMC core supporting member 17 is an exemplary arrangement. The position of the EMC core supporting section 17a on the upper surface of the EMC core supporting member 17 can be readily modified. Therefore, degree of design freedom when the structure according to the second embodiment is employed in the circuit unit is greater than that employing a conventional structure.

Figure 3A:
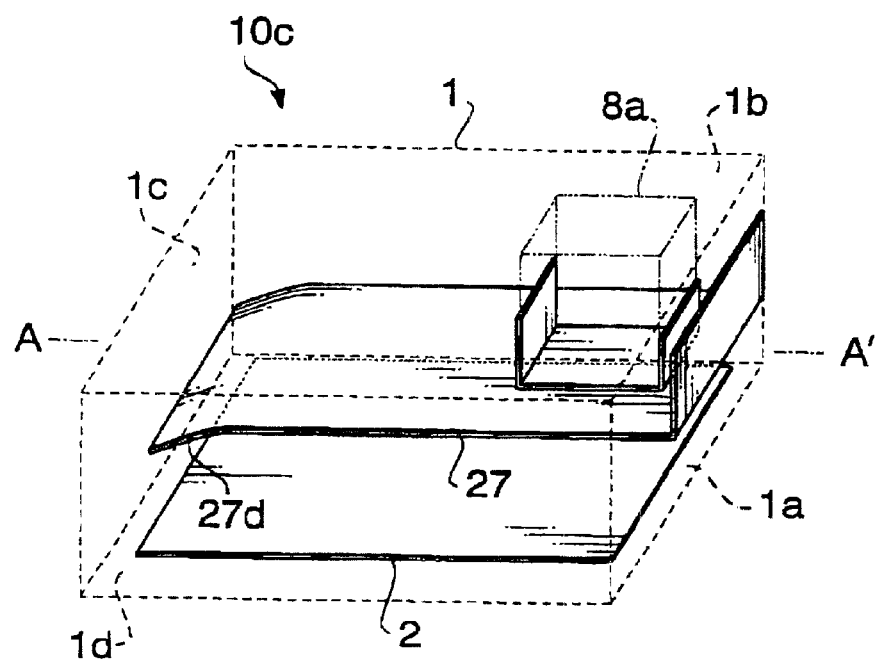
Figure 3B:
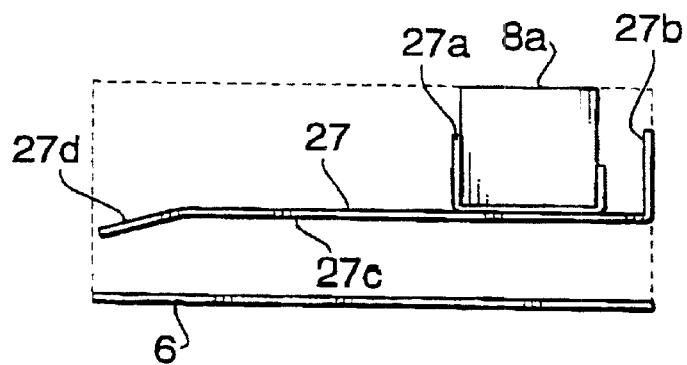

FIGS. 3A and 3B show an EMC core supporting member 27 according to a third embodiment of the invention. FIG. 3A shows an inner structure of the circuit unit 10c, in which the EMC core supporting member 27 is employed. FIG. 3B is a cross section of the EMC core supporting member 27 taken along line A–A' of FIG. 3A. The EMC core supporting member 27 is formed with an inclined portion 27d, which is formed by bending a tip end portion of a shielding member 27c. The inclined portion 27d improves shielding effect for the printed circuit board 2.

Further, the EMC core supporting member 27 supports, with use of the EMC core supporting section 27a, a single EMC core 8a. Similarly to the first and second embodiments, the side surfaces 1a through 1d are made of metal. By penetrating screws through screw holes (not shown in the drawing) formed on the connection section 27b, the EMC supporting member 27 is fixed on to a side surface 1a of the housing 1, and is electrically connected thereto.

By the side surfaces 1a–1d of the housing 1, the EMC core supporting member 27 and the shielding plate 6, the entire printed circuit board 2 is shielded.

Figure 4:
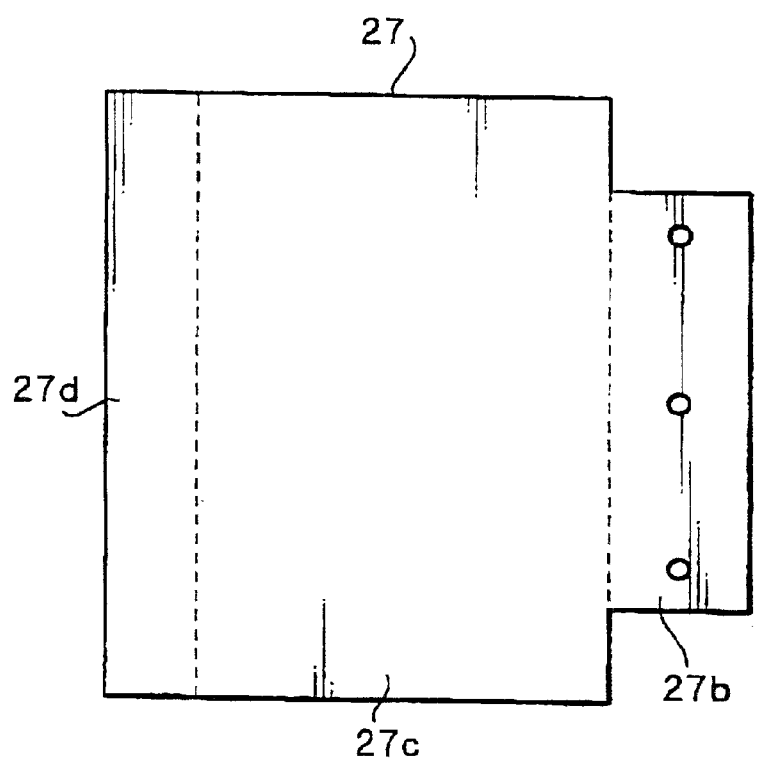
FIG. 4 is a developed view of the EMC core supporting member shown in FIGS. 3A and 3B.

FIG. 4 is a developed view of the EMC core supporting member 27 shown in FIGS. 3A and 3B. In FIG. 4, a broken line indicates a position to be bent. By bending the EMC core supporting member 27 at the broken lines, the inclined portion 27d and the connection portion 27b are formed as shown in FIGS. 3A and 3B. It should be noted that a surface 27c facing the printed circuit board 2 has an area sufficient to cover the printed circuit board 2.

It should be noted that the number and size of EMC cores to be employed should be determined depending on the individual device, and the above-described embodiments only show exemplary structures. For example, in the first or second embodiment, the number of EMC cores is not limited to two. A single or more than two EMC cores may be employed. Similarly, in the third embodiment, more than one EMC cores may be employed.

The present disclosure relates to the subject matter contained in Japanese Patent Application No. 2001-251293, filed on Aug. 22, 2001, which is expressly incorporated herein by reference in its entirety.

What is claimed is:

1. An EMC core supporting structure for supporting at least one EMC core inside a casing which accommodates a printed circuit board, said EMC core supporting structure including a plate member capable of shielding electro-magnetic waves, said plate member expanding inside the casing to substantially cover the printed circuit board, at least one side portion of said plate member being connected to an inner wall of said casing, a supporting portion that receives said at least one EMC core being formed on a surface of said plate member opposite to a surface facing the printed circuit board for mounting said at least one EMC core on said plate member.

2. The EMC core supporting structure according to claim 1, wherein said at least one side portion of said plate member includes a portion which is bent to form a U-shaped portion having two parallel surfaces facing each other and a connecting portion that connects said two parallel surfaces, said connecting portion being secured to said inner wall of said casing.

3. The EMC core supporting structure according to claim 2, wherein said at least one EMC core is held within a space defined by said two parallel surfaces and said connecting portion.

4. The EMC core supporting structure according to claim 3, wherein said at least one EMC core and said connecting portion are fastened together and secured on said inner wall using screws.

5. The EMC core supporting structure according to claim 1, wherein said at least one side portion of said plate member includes a portion that is bent to form an L-shaped portion, which is secured onto said inner wall of said casing.

6. The EMC core supporting structure according to claim 5, wherein an EMC core receiving portion is integrally provided on said plate member, said at least one EMC core being held by said EMC core receiving portion.

7. The EMC core supporting structure according to claim 6, wherein said EMC core receiving portion comprises a U-shaped portion having two parallel surfaces and a connecting portion that connects said two parallel surfaces, said connecting portion being secured on said plate member, said at least one EMC core being held within a space defined by said two parallel surfaces and said connecting portion.

8. The EMC core supporting structure according to claim 7, wherein said L-shaped portion is secured on said inner wall using screws.

9. The EMC core supporting structure according to claim 1, wherein only one side portion of said plate member is secured onto said inner wall, an opposite side portion being bent to form a bent portion, which is bent toward the printed circuit board.

10. A printed circuit board shielding structure employed in a casing which accommodates a printed circuit board, said shielding structure including a plate member capable of shielding electro-magnetic waves, said plate member expanding inside the casing to substantially cover the printed circuit board, said casing having at least side walls capable of shielding electro-magnetic waves, each of said side walls being substantially perpendicular to the surface of the printed circuit board, said side walls surrounding said printed circuit board, at least one side portion of said plate member being connected to an inner surface of one of said side walls, a supporting portion that receives at least one EMC core being formed on a surface of said plate member opposite to a surface facing the printed circuit board for mounting said at least one EMC core on said plate member.

11. The printed circuit board shielding structure according to claim 10, further comprising a lower plate arranged on an opposite side of said plate member with respect to said printed circuit board, said lower plate being capable of shielding electro-magnetic waves, said lower plate having an area covering said printed circuit board, said printed circuit board being shielded by said plate member, said side walls and said lower plate.

12. An EMC core supporting member having a plate member capable of shielding electro-magnetic waves, a supporting portion for supporting an EMC core being formed on one surface, of said plate member, a connection portion being formed on a side portion of said plate member, said connection portion being formed by bending said plate member.

13. An EMC core supporting member formed of a plate member capable of shielding electro-magnetic waves, comprising:
   a shielding portion; and
   an EMC core supporting portion which is formed by bending said plate member corresponding to an external shape of at least one EMC core so as to hold the at least one EMC core.

14. The EMC core supporting member according to claim 13, which is provided inside a casing of an electronic device, said EMC core supporting portion having an area contacting the casing, said EMC core supporting portion being secured to the casing at said area contacting the casing with screws.

15. A shielding structure for shielding a printed circuit board employed in an electronic device, comprising:
   an EMC core supporting member arranged on one side of the printed circuit board;
   a shielding plate arranged on the other side of the printed circuit board,
   said EMC core supporting member formed of a plate member capable of shielding electromagnetic waves, said EMC core supporting member having a shielding portion and an EMC core supporting portion which is formed by bending said plate member corresponding to an external shape of at least one EMC core so as to hold said at least one EMC core, said EMC core supporting portion being formed on a surface of said EMC core supporting member opposite to a surface facing said printed circuit board.

16. The shielding structure according to claim 15, wherein a casing of said electronic device is made of metal, said EMC core supporting member being electrically connected with said casing.

* * * * *